TERMINAL CONSTRUCTION FOR ELECTRICAL CIRCUIT ELEMENT

Filed Dec. 16, 1968

INVENTOR.
JOHN P. DOERING JR.
BY Gerald L. Mehlhoff
ATTORNEY

United States Patent Office 3,536,821
Patented Oct. 27, 1970

3,536,821

TERMINAL CONSTRUCTION FOR ELECTRICAL CIRCUIT ELEMENT

John P. Doering, Jr., Santa Ana, Calif., assignor to Beckman Instruments, Inc., a corporation of California Filed Dec. 16, 1968, Ser. No. 783,823
Int. Cl. H05k *1/10*
U.S. Cl. 174—68.5 8 Claims

ABSTRACT OF THE DISCLOSURE

A terminal structure for use with a nonconductive substrate having an electrical circuit network supported thereon. The electrical network includes a conductive connector extending adjacent an outer edge of the substrate. A resilient terminal, formed from a strip of electrically conductive material is positioned on the surface of the substrate. The terminal has a downturned edge which is inserted in a slot formed on the surface of the substrate so that the terminal is locked in place when a clamping means is fastened through a hole formed in the terminal thereby clamping the terminal to the substrate. The compression of the clamping means forces a lower surface of the terminal into electrical engagement with the conductive connector formed on the substrate.

SUMMARY OF THE INVENTION

This invention is particularly applicable to electrical circuit devices such as microcircuit networks, or switching devices employing ceramic or plastic substrates that tend to expand under varying temperature conditions.

In general, electrical circuit modular devices comprise a plurality of active or passive electrical components supported on a flat surface of a thin nonconductive base member formed of a plastic or ceramic material. These components may be capacitors, resistors and transistor devices or the like and may be in the form of components deposited on the substrate or may be discrete components supported on the substrate. The components are electrically connected by means of a deposited electrical network formed of electrically conductive material which is bonded or otherwise attached to the surface of the substrate. The device requires some means for electrically connecting the electrical network to external sources of power or for electrically connecting the device into other electrical apparatus. In micromodule technology, various termination arrangements have been employed in the past, such as lead wires soldered to the deposited layer material or spring clamp terminals which clamp over the edge of the device in contact with the conductive material thereon.

Other types of terminals include terminal members which are clamped or retained on the substrate by means of a rivet or eyelet means passing through the terminal and through a hole formed in the substrate. In order to attach the terminal in this way, it has been the practice in the past to clamp the terminal so that the lower surface thereof is forced solidly against the substrate. The frictional force created by this high pressure clamp usually prevents movement of the terminal which might result in interruption of the electrical contact between the terminal and the electrical conductive film layer on the surface of the substrate. However, when such terminals are riveted or solidly clamped onto the substrate, any expansion of the substrate either causes the substrate to fracture or deforms the terminal or its rivet, eyelet or clamp. When this happens, the electrical connection between the terminal and the deposited network may be interrupted. If the compression means or clamp is deformed and the substrate then contracts, the terminal becomes loose and the electrical contact of the conductive layer may be interrupted. One means for overcoming this problem has been described in the patent application of John P. Doering, Jr. et al., Ser. No. 741,428 entitled "Terminal Construction for Electrical Circuit Element" filed July 1, 1968, which is assigned to Beckman Instruments, Inc., the asignee of the present invention. The terminal of the present application is an improvement over the aforementioned Doering et al. construction.

OBJECTS

It is an object of the present invention to provide a new and improved terminal structure that may be attached to a substrate by a compression clamping means, such as a rivet or eyelet, which permits a reasonable amount of expansion and contraction between the substrate and the clamping means and which assures that rotational movement of the terminal about the clamping means is negligible.

DESCRIPTION OF THE PREFERRED EMBODIMENTS

Figures 1, 2, 3, 4, 5, 6:
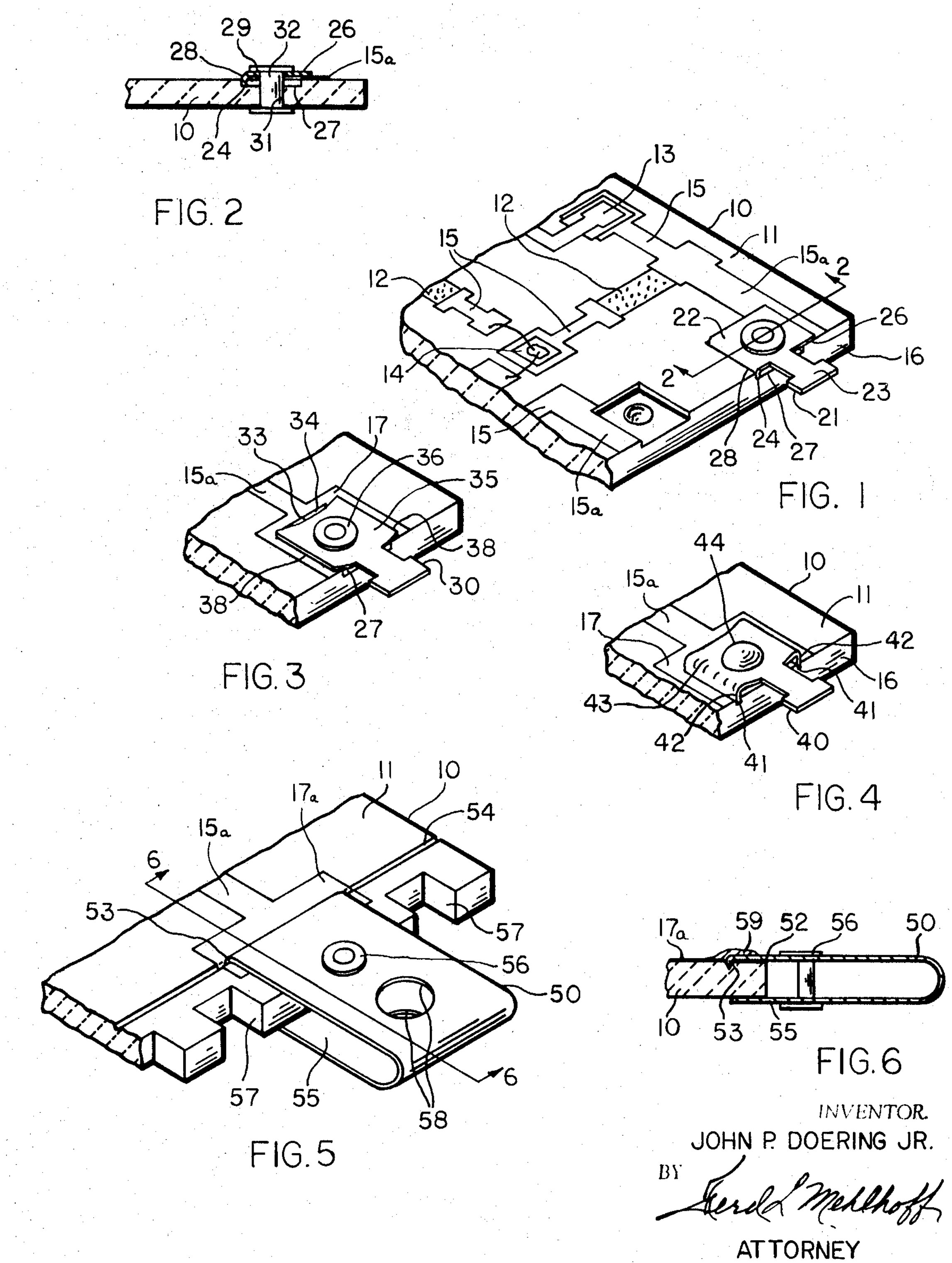
FIG. 1 is a perspective view of a portion of a base member having an electrical circuit network attached thereto and illustrating one embodiment of the terminal structure of the present invention.
FIG. 2 is a cross-sectional view taken along line 2—2 of FIG. 1.
FIG. 3 is a perspective view illustrating an embodiment of the invention.
FIG. 4 is a perspective view illustrating another embodiment of the invention.
FIG. 5 is a perspective view illustrating still another version of the invention with the hole for the clamping means formed as a notch in the edge of the substrate member.
FIG. 6 is a cross-sectional view taken along line 6—6 of FIG. 5.

Referring now to FIG. 1, there is shown an enlarged view of a microcircuit device including a suitable base member or substrate 10 having deposited on the flat surface 11 thereof an electrical network, including a plurality of resistance elements 12, a capacitor 13, a transistor device 14 and a network of conductive material forming electrical connectors 15 arranged to conduct an electrical current between the various components of the device. As may be seen in FIG. 1, at least one electrical conductor 15*a* extends adjacent the outer edge 16 of the device.

Preferably, the substrate base member 10 or wafer is formed of a nonconductive, high temperature resistant material such as a ceramic material of alumina, steatite, or the like. Other types of materials may be employed, such as glass filled epoxy, or any other plastic or insulating material.

In the version of the invention disclosed in FIG. 1 the components are all attached directly to the surface 11 of the substrate. Other such components such as discrete resistors, discrete capacitors and transistors may be attached in any well known manner such as by leads or mounting studs supported through mounting holes formed in the substrate. In any such device, it is desirable to have the electrical network 15 deposited on the surface 11 of the substrate. Electrical connection between the network conductors 15 and discrete components can be made in any well known manner, such as by lead wires soldered to the network and such devices.

The deposited network of interconnecting electrical connectors, including the conductive connector 15*a*, is best formed of a material which makes a bond with the base member. When the base member is a ceramic, such as steatite or alumina, it is preferable to employ a "fired-on" conductive material which reacts with the surface of the substrate at high temperatures. Such a "fired-on" conductive material to be used with a ceramic base should preferably contain, a small percentage of glass or metal oxide which thoroughly wets the surface of the ceramic substrate at a temperature high enough to melt the glass. While the relative quantities of conductive material and glass in these materials may vary substantially, depending upon the materials employed, tested embodiments have used from 10 to 60 percent glass or metal oxides and from 40 to 90 percent powdered metal conductive particles such as gold, palladium, silver or other noble metal particles. The glass constituent of the "fired-on" material reacts with the steatite or alumina substrate and a portion of the substrate actually melts or fuses into the glass "fired-on" material to form an extremely durable bond. The conductive metal particles are, in turn, securely retained in the glass binder to form a conductive path to the respective components.

The glassy "fired-on" material cannot readily be peeled away from the surface of the base member and the surface of such material is extremely hard, resisting abrasion and wear during use of the device. In practice, the material forming the conductive connectors, is screened or otherwise applied onto the substrate and fired in place thereon. The resistance elements, capacitive elements and other active or passive components of the electrical circuit are then attached or applied to the surface of the substrate. The resistive elements and capacitive elements may then be "tailored" in order to provide the desired values for these components.

As will be seen in the embodiment of FIG. 1, at least one of the electrically conductive connectors 15*a* extends adjacent the outer edge 16 of the substrate. In other arrangements, such as those shown in FIGS. 3–5, a connector may also include a termination pad 17 or 17*a* which is arranged along the edge 16, or close to the edge, of the substrate. The electrical connector 15*a*, or pads 17 (17*a*), are contacted by terminals, which are attached to the base member and to which electrical leads or other electrical attachments may be connected.

As will be seen in FIG. 1, the terminal 21 is formed of a thin sheet of resilient material having a forward connecting portion 22 and a rearwardly extending shank 23, which extends out beyond the edge 16 of the substrate. In this embodiment of the invention, as may best be seen in FIG. 2, at least one edge 24 of the contact portion of the terminal is bent downwardly toward the substrate 10. The edge or bottom surface 26 of the terminal opposite from the edge 24 rests on the surface of conductive connector 15*a* and is arranged in good electrical contact therewith.

In order to support the terminal and prevent movement thereof, the substrate is provided with a slot 27, forming a straight shoulder or edge surface 28 against which the bent over edge 24 of the terminal abuts. When resting in the slot 27, the edge 24 supports the contact or forward portion of the terminal slightly above the surface 11 of the substrate. As may best be seen in FIG. 2, the contact portion of the terminal includes a hole 29 therein which is adapted to align with a suitable hole 31 formed through the substrate, adjacent the outer edge 16 thereof. The terminal 21 is attached to the substrate by means of a compressive clamping means positioned through the respective holes, or openings 29 and 31, of the terminal 21 and substrate 10. In a preferred embodiment of the invention, the clamping means comprises an eyelet 32 as shown in FIG. 2. The compressive means may also comprise a rivet, such as rivet 44 shown in FIG. 4.

Referring to FIG. 1, the rearward portion 23 of the terminal 21 extends outwardly beyond the free edge 16 and may include a notched shank to which external leads or connectors may be attached. As will be seen in FIG. 2, the eyelet 32 forces the surface 26 of the terminal downwardly against the upper surface of the conductive connector 15*a* to make a good electrical contact. The space between the hole 29 in the terminal and the downwardly turned edge 24 abutting against the shoulder 28 of the slot 27 is such that the edge 24 is forced directly against the shoulder 28. The shoulder 28 prevents any rotational movement of the terminal about the eyelet 32 when attachments are made to the shank 23.

The embodiment shown in FIG. 3 illustrates a somewhat different version of the invention in which the contact pad 17 is formed completely around the slot 27. In this embodiment of the invention the terminal 30 is arranged with the forward edge 33 of its contact portion 35 abutting against the inner edge or shoulder 34 of the slot 27. The terminal is placed in compression by the force of the eyelet 36 so that the center portion of the contact portion 35 is slightly bowed into the slot 27 and the outer edges, or lower surfaces 38 of the outer edges are forced into contact with the shoulders of the slot 27 to make good electrical contact with the pad 17. In its preferred form, the edges of the slot 27 are slightly beveled and the conductive pad 17 is deposited thereon so that reasonably good electrical contact is made between the forward or contact portion 35 of the terminal and the connector pad 17.

FIG. 4 illustrates another embodiment of the invention in which the pad 17 is formed in rectangular shape adjacent the edge 16 of the substrate 10. In this embodiment, a pair of slots 41 are formed in the surface 11 of the substrate 10 substantially perpendicular to the edge 16 of the substrate. The conductive connector material is deposited so that it lines the edges of the slots 41. The outer edges 42 of the contact portion 43 of the terminal 40 are bent over and inserted into the slots 42 when the terminal is positioned on the substrate. The terminal is then attached onto the substrate by a clamping means, such as the rivet 44 shown in FIG. 4. The contact portion of the terminal is slightly bowed, as in the example of FIG. 3, so that the terminal is securely supported on the substrate. However, as in the case of the terminal of FIG. 3, the lower surface of the contact portion is not pulled tight against the upper surface of the substrate. This permits relative expansion between the substrate and the clamp means or rivet without deforming the clamp means or breaking the substrate.

FIGS. 5 and 6 illustrate still another embodiment of the invention in which the terminal 50 is of a generally U-shaped cross-section having a pair of arms 52 and 55 spaced apart approximately the thickness of the substrate 10. As will be seen in FIG. 6, the upper arm 52 has its forward edge portion 53 rolled over in a direction toward the lower arm 55. In this embodiment of the invention, a slot 54 is formed substantially parallel to the outer edge of the substrate and passes through the pad 17*a* formed on the surface of the substrate. Preferably the conductive material is also deposited into the slot 54.

In the embodiment of the invention disclosed in FIGS. 5 and 6, the terminal 50 is positioned over the outer edge of the substrate with a downwardly turned edge 53 of the terminal positioned within the slot 54. The upper arm 52 is positioned adjacent the upper surface 11 of the substrate and the lower arm 55 is arranged beneath the lower surface of the wafer or substrate 10. As will be seen in FIG. 5, the outer edge portion of the substrate is provided with a plurality of notches 57 of a dimension sufficient to receive the diameter of an eyelet member 56. The terminal 50 is provided with aligned mounting holes, formed through the upper and lower arms (52 and 55), which receive the eyelet 56. When the eyelet is inserted through the upper and lower arms and the edges of the rivet peened over to hold the terminal in place, the forward edge 53 of the terminal is forced into the slot 54 thereby preventing the terminal from being easily removed from the substrate. The under or interior surface of the arm 52 engages upper surface of the pad 17*a* and the downwardly turned edge 53 engages that portion of the conductive material within the slot 54 thereby making good electrical contact with the conductive pad 17*a*.

In this embodiment of the invention, the terminal may be provided with openings 58 to which a conductive lead or other attachment may be made. Because the rivet is not directly applied to the surface of the substrate, there is a reasonable amount of expansion of the substrate possible between the arms 52 and 55 of the terminal. The resiliency of the terminal arms 52 and 55 maintains a good electrical contact with the connector pad 17*a* as the substrate expands and contracts. The interlocking action between the downwardly turned edge 53 and the slot 54 prevents rotation of the terminal 50 with respect to the rivet 56 or the pad 17*a* and promotes reasonably good electrical contact therewith.

As may be seen in FIG. 6, it may be desirable, in order to improve the electrical connection between the terminal 50 and the conductive pad 17*a*, to deposit an electrically conductive solder material 59 over the forward edge portion of the terminal and the conductive pad 17*a*. Obviously, the conductive solder material 59 may also be employed with the other embodiments shown in FIGS. 1–4 to assure good electrical connection between the terminal and the conductive connector.

While in accordance with the patent statutes there have been described what are considered to be the preferred embodiments of the invention, it will be obvious to those skilled in the art that various changes and modifications may be made therein without departing from the invention and it is, therefore, the aim of the appended claims to cover all such changes and modifications as fall within the true spirit and scope of the invention.

What is claimed is:

1. In an electrical component, the combination comprising:

a nonconductive substrate having a flat surface supporting an electrically conductive network thereon including at least one conductive connector extending adjacent an outer edge of said substrate;

at least one slot is formed in said surface of said substrate, said slot forming a shoulder contiguous with a portion of said conductive connector;

a terminal in the form of a thin strip of electrically conductive material, said terminal being positioned on said substrate and having a hole therein, said terminal having an edge portion thereof engaging said shoulder formed by said slot with a flat surface of said terminal contacting said conductive connector; and clamping means positioned through said respective hole in said terminal and forcing said terminal against said substrate, said edge portion of said terminal being held against said shoulder of said slot preventing rotational motion of said terminal with respect to said substrate with said flat surface of said terminal being forced into contact with said conductive connector.

2. In an electrical component, the combination comprising:

a nonconductive substrate having a flat surface supporting electrical components thereon and including a deposited network of electrically conductive material connecting said components, said network including at least one conductive connector extending adjacent an outer edge of said substrate, said substrate including a terminal mounting hole therethrough adjacent said outer edge of said substrate;

at least one slot formed in said surface of said substrate, said slot forming a shoulder contiguous with a portion of said conductive connector;

a terminal in the form of a thin strip of electrically conductive material, said terminal being positioned on said substrate and having a hole therein in alignment with said terminal mounting hole in said substrate, said terminal having an edge portion thereof engaging said shoulder formed by said slot with a flat surface of said terminal contacting said conductive connector; and clamping means positioned through said respective holes in said terminal and said substrate attaching said terminal to said substrate, said edge portion of said terminal locking against said shoulder of said slot preventing rotational motion of said terminal about said clamping means and said flat surface of said terminal being forced into contact with said conductive connector.

3. The combination defined in claim 1 in which said edge portion of said terminal is bent downwardly substantially normal to said terminal and positioned within said slot formed in said substrate, said edge supporting said terminal above said surface of said substrate and said clamping means exerting a pressure on said terminal forcing said flat surface thereof into engagement with said conductive connector.

4. The combination defined in claim 2 in which said slot forms a rectangular opening adjacent said outer edge of said substrate and said terminal mounting hole through said substrate opens into said slot, said terminal having its edges on opposite sides of said hole through said terminal extending beyond the slot into contact with said conductive connector deposited adjacent said slot and said forward edge of said terminal abutting against an edge of said slot.

5. The combination defined in claim 1 in which said conductive connector adjacent said outer edge of said substrate is substantially rectangular in shape and a pair of slots are formed in the surface of said substrate normal to said outer edge thereof, and said terminal is provided with a pair of downwardly extending edge portions disposed within said pair of slots, said downwardly extending edge portions supporting said terminal above said substrate.

6. In an electrical component, the combination comprising:

a nonconductive substrate having a flat surface supporting electrical components thereon and including a deposited network of electrically conductive material connecting said components, said network including at least one conductive connector extending to and forming a substantially rectangular pad adjacent an edge of said substrate, said substrate including a terminal mounting hole therethrough, said hole opening in said rectangular pad formed adjacent said substrate;

at least one slot formed in said surface of said substrate, said slot forming a shoulder contiguous with a portion of said conductive pad;

a terminal member formed of a thin strip of conductive material, said terminal being positioned on said substrate and having a hole therein in alignment with said terminal mounting hole of said substrate, said terminal having at least one downwardly bent edge portion extending into said slot formed in said substrate and supporting said terminal above said pad thereon;

clamping means positioned through said respective holes in said terminal and said substrate forcing the lower surface of said terminal into contact with said pad, said downwardly bent edge portion of said terminal locking against said shoulder of said slot preventing rotational motion of said terminal about said clamping means.

7. The combination defined in claim 6 in which there are two slots formed substantially normal to the edge of said substrate and the terminal is provided with a pair of downwardly extending edge portions on opposite sides of the mounting hole, said edge portions extending into said slots formed in said substrate and supporting said lower surface of said terminal above said substrate.

8. In an electrical component, the combination comprising:

a nonconductive substrate having a flat surface supporting electrical components thereon and including a deposited network of electrically conductive material connecting said components, said network including at least one conductive connector extending adjacent an edge of said substrate, said substrate including at least one terminal mounting notch formed in said outer edge of said substrate;

a slot formed in said surface of said substrate along said edge thereof and extending through said conductive connector adjacent said edge thereof;

a terminal member in the form of a thin strip of conductive material formed in a substantially U-shaped cross-section with a pair of substantially parallel arms, each of said arms of said terminal having a hole therein in alignment with said terminal mounting notch in said substrate, said terminal being positioned with said arms thereof disposed on opposite sides of said substrate, said arm of said terminal adjacent said conductive connector having its edge bent downwardly into said slot formed on said substrate and the interior surface of said terminal adjacent said downwardly bent portion thereof in contact with said conductive connector; and clamping means positioned through said holes in said arms of said terminal and said notch in said substrate, said clamping means forcing said arms of said terminal against the upper and lower surfaces of said substrate locking said terminal in place on said substrate, said downwardly bent edge portion of said terminal locking against said shoulder of said shoulder of said slot preventing rotational motion of said terminal with respect to said substrate.

References Cited

UNITED STATES PATENTS

| | | | |
|---|---|---|---|
| 2,131,581 | 9/1938 | Catron et al. | 339—219 |
| 2,210,487 | 8/1940 | Kimmich | 339—219 XR |
| 2,641,748 | 6/1953 | Peters. | |
| 2,954,540 | 9/1960 | Stupar | 339—17 |
| 2,962,692 | 11/1960 | White | 339—220 |
| 2,993,188 | 7/1961 | Anderson | 339—220 XR |
| 3,155,767 | 11/1964 | Schellack | 174—68.5 |

DARRELL L. CLAY, Primary Examiner

U.S. Cl. X.R.

29—626; 317—101; 339—17—219